(12) United States Patent
Chien et al.

(10) Patent No.: US 7,529,317 B2
(45) Date of Patent: May 5, 2009

(54) SUPPLY INDEPENDENT SCHMITT TRIGGER RC OSCILLATOR

(75) Inventors: Chin Ming Chien, Irvine, CA (US); Bojko F. Marholev, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 632 days.

(21) Appl. No.: 11/236,191

(22) Filed: Sep. 27, 2005

(65) Prior Publication Data

US 2007/0069828 A1 Mar. 29, 2007

Related U.S. Application Data

(60) Provisional application No. 60/720,576, filed on Sep. 26, 2005.

(51) Int. Cl.
*H04L 27/00* (2006.01)
(52) U.S. Cl. ...................................... 375/316
(58) Field of Classification Search ................ 375/219, 375/244, 220, 316, 372; 455/426, 511, 524, 455/557, 403, 422, 420; 379/106.03, 368; 331/59, 60, 135, 137
See application file for complete search history.

(56) References Cited

U.S. PATENT DOCUMENTS 6,125,139 A * 9/2000 Hendrickson et al. ....... 375/220
2005/0243059 A1* 11/2005 Morris et al. ............... 345/158

* cited by examiner

*Primary Examiner*—Sam K Ahn
(74) *Attorney, Agent, or Firm*—Garlick Harrison & Markison; Robert A. McLauchlan, III; Shayne X. Short

(57) ABSTRACT

Embodiments of the present invention provide an oscillator circuit having a steady output frequency that is independent of the supplied voltage. This oscillator includes a Schmitt trigger circuit which may be implemented within an integrated circuit of a wireless terminal or other like portable electronic device. The Schmitt trigger circuit receives a threshold voltage input and a second voltage input. The Schmitt trigger circuit generates an output voltage equal to either a first output voltage or a second output voltage based on the results of comparing the threshold voltage input to the second voltage input. An RC network may be coupled to the output of the Schmitt trigger circuit and is operable to supply the second voltage input to the Schmitt trigger circuit. A voltage divider network also couples to the output of the Schmitt trigger circuit wherein the threshold voltage input is proportional to the first output voltage reduced by the voltage divider network based on the output voltage of the Schmitt trigger circuit.

21 Claims, 9 Drawing Sheets

SUPPLY INDEPENDENT SCHMITT TRIGGER RC OSCILLATOR

CROSS REFERENCES TO RELATED APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/720,576, entitled "Supply independent Schmitt RC oscillator," filed Sep. 26, 2005.

BACKGROUND

1. Technical Field

The present invention relates generally to oscillators, and more particularly to the type of oscillator utilized in high frequency power converters where initial and final frequencies are required to be well defined.

2. Related Art

Cellular wireless communication systems support wireless communication services in many populated areas of the world. While cellular wireless communication systems were initially constructed to service voice communications, they are now called upon to support data communications as well. The demand for data communication services has exploded with the acceptance and widespread use of the Internet. While data communications have historically been serviced via wired connections, cellular wireless users now demand that their wireless units also support data communications. Many wireless subscribers now expect to be able to "surf" the Internet, access their email, and perform other data communication activities using their cellular phones, wireless personal data assistants, wirelessly linked notebook computers, and/or other wireless devices. The demand for wireless communication system data communications will only increase with time. Thus, cellular wireless communication systems are currently being created/modified to service these burgeoning data communication demands.

Cellular wireless networks include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its cell/sectors. A BSC coupled to the base station routes voice communications between the MSC and a serving base station. The MSC routes voice communications to another MSC or to the PSTN. Typically, BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals.

To conserve power, the wireless terminal may sleep when not actively communicating with a servicing base station. However, to ensure no communications are missed, the wireless terminal awakens periodically to receive a page burst that indicates if the wireless terminal must service a communication from the servicing base station. Various other electronic devices may enter a sleep mode as well in order to conserve power. To realize this advantage, the timing associated with the sleep mode should be accurately controlled in order to allow the wireless telephone to awaken at predetermined intervals to check for received messages or pages. Thus, it is important to have an accurate low power oscillator for timing when to awaken from or enter into the sleep mode and effectively conserve power.

One such low power oscillator is a Schmitt trigger RC oscillator. FIG. 1 depicts a general Schmitt trigger RC oscillator 10. Schmitt trigger RC oscillator 10 includes an operational amplifier 12 that receives a first voltage input or threshold voltage input $V_P$ and a second voltage input $V_N$. Operational amplifier 12 generates an output voltage, $V_{OUT}$, equal to a first output voltage, $V_{DD}$, when $V_P$ is greater than $V_N$; or a second output voltage, such as ground, when $V_P$ is less than $V_N$. A resistive capacitive (RC) network 14 couples to the output of operational amplifier 12 and supplies $V_N$ to operational amplifier 12. Additionally a voltage divider 16 also couples to the output of operational amplifier 12. As shown here, $V_P$ is supplied from the voltage divider 16, as the voltage seen at the node between resistors R1 and R2.

When $V_P > V_N$, $V_{OUT}$ goes to $V_{DD}$ and begins to charge capacitor $C_X$. This increases the voltage $V_N$. During this charging period, $V_{P1} = V_{REF} + R_1/(R_1+R_2)*(V_{DD}-V_{REF})$. When $V_N$ exceeds the switching point $V_P$, $V_{OUT}$ goes to ground and begins to discharge capacitor $C_X$. This decreases the voltage $V_N$. During this discharging period, $V_{P2} = R_2/(R_1+R_2)*V_{REF}$. Then, the switching point defined by $V_P$ is a function of $V_{DD}$ and $V_{REF}$. During Charging Period, $V_N$ may be defined as $$V_N = V_{DD}\left(1 - e^{\frac{-t_1}{R_X C_X}}\right) + V_{P2}\left(e^{\frac{-t_1}{R_X C_X}}\right) = V_{P1}.$$

During the discharging period, $V_N$ may be defined as $$V_N = V_{P1} * e^{\frac{-(t_2-t_1)}{R_X C_X}} = V_{P2}.$$

Solving these two equations, where for example $R_1 = R_2$, yields an expression for the period of the oscillator be defined $$\text{as } t_2 = -R_X * C_X * \ln\left(\frac{\frac{1}{2}(V_{DD} - V_{REF})}{V_{DD} - \frac{1}{2}V_{REF}} * \frac{V_{REF}}{V_{DD} + V_{REF}}\right).$$

Thus, the frequency of the oscillator may be defined as $$\frac{1}{t_2},$$

which is a function $(R_X, C_X, V_{DD}, V_{REF})$.

The output of the operational amplifier may be a continuous square wave as shown in FIG. 2. The frequency of this square way depends on the values of R and C and the threshold points of the Schmitt trigger. The Schmitt trigger RC oscillator circuit may be easily incorporated within an integrated circuit (IC). However, it should be noted that the frequency stability is lacking as the frequency is dependent on the input voltage $V_{DD}$ and $V_{REF}$ for the reasons shown above. As the input voltage can vary as much as +/−10 percent, the frequency may also vary +/−10 percent. This level of variation makes the Schmitt trigger oscillator unacceptable as an accurate timing source for determining when to awaken from or enter into the sleep mode and effectively conserve power.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

Figure 3:
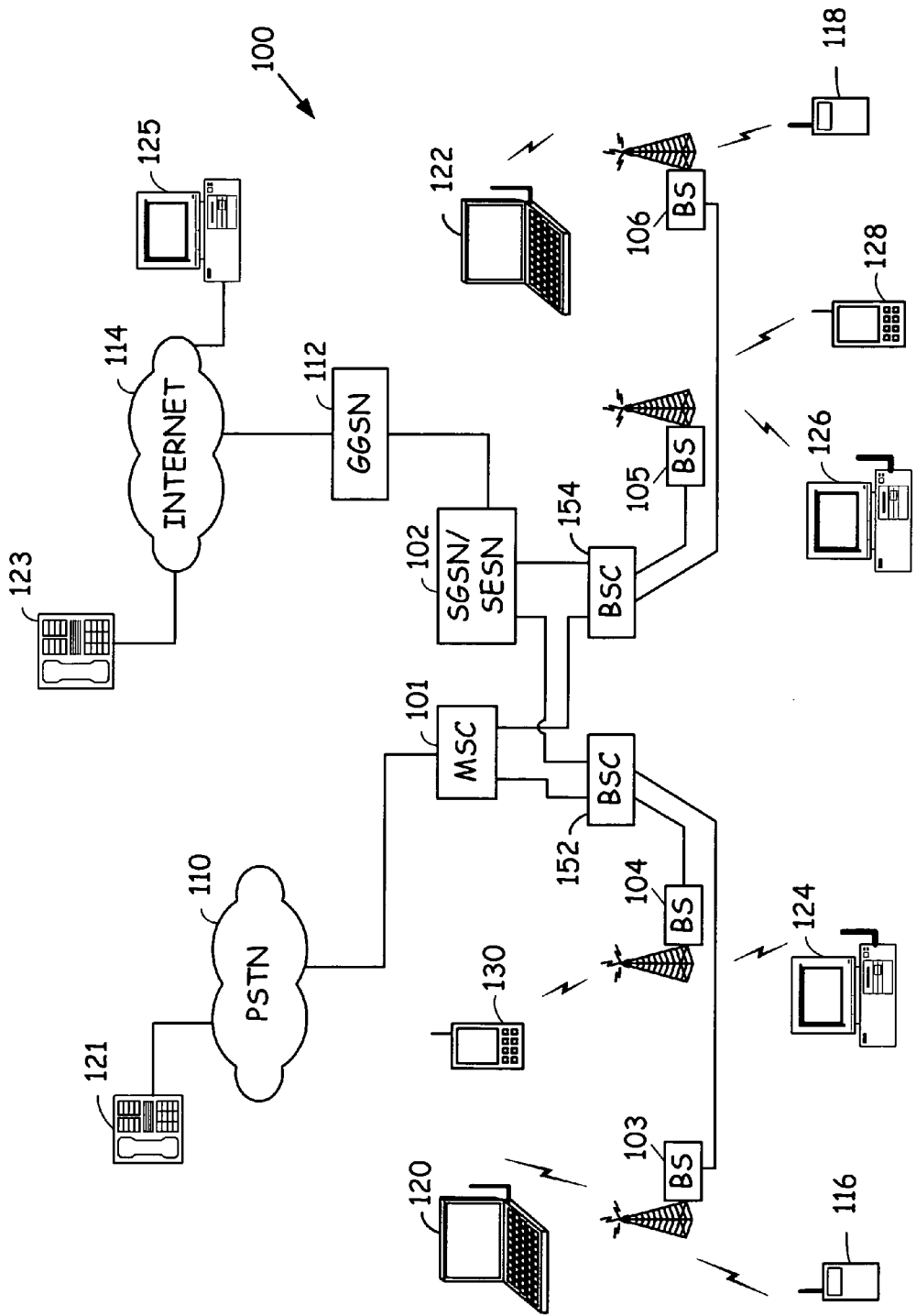
FIG. 3 is a system diagram illustrating a portion of a cellular wireless communication system that supports wireless terminals operating according to the present invention.

FIG. 3 is a system diagram illustrating a portion of a cellular wireless communication system 100 that supports wireless terminals operating according to the present invention. The cellular wireless communication system 100 includes a Mobile Switching Center (MSC) 101, Serving GPRS Support Node/Serving EDGE Support Node (SGSN/SESN) 102, base station controllers (BSCs) 152 and 154, and base stations 103, 104, 105, and 106. The SGSN/SESN 102 couples to the Internet 114 via a GPRS Gateway Support Node (GGSN) 112. A conventional voice terminal 121 couples to the PSTN 110. A Voice over Internet Protocol (VoIP) terminal 123 and a personal computer 125 couple to the Internet 114. The MSC 101 couples to the Public Switched Telephone Network (PSTN) 110.

Each of the base stations 103-106 services a cell/set of sectors within which it supports wireless communications. Wireless links that include both forward link components and reverse link components support wireless communications between the base stations and their serviced wireless terminals. These wireless links support digital data communications, VoIP communications, and other digital multimedia communications. The cellular wireless communication system 100 may also be backward compatible in supporting analog operations as well. The cellular wireless communication system 100 supports the Global System for Mobile telecommunications (GSM) standard and also the Enhanced Data rates for GSM (or Global) Evolution (EDGE) extension thereof. The cellular wireless communication system 100 may also support the GSM General Packet Radio Service (GPRS) extension to GSM. However, the present invention is also applicable to other standards as well, e.g., TDMA standards, CDMA standards, etc. In general, the teachings of the present invention apply to digital communications that combine Automatic Repeat ReQuest (ARQ) operations at Layer 2, e.g., LINK/MAC layer with variable coding/decoding operations at Layer 1 (PHY).

Wireless terminals 116, 118, 120, 122, 124, 126, 128, and 130 couple to the cellular wireless communication system 100 via wireless links with the base stations 103-106. As illustrated, wireless terminals may include cellular telephones 116 and 118, laptop computers 120 and 122, desktop computers 124 and 126, and data terminals 128 and 130. However, the cellular wireless communication system 100 supports communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116-130 are therefore enabled to support the GPRS and/or EDGE operating standard as well as supporting the voice servicing portions the GSM standard.

Figure 4:
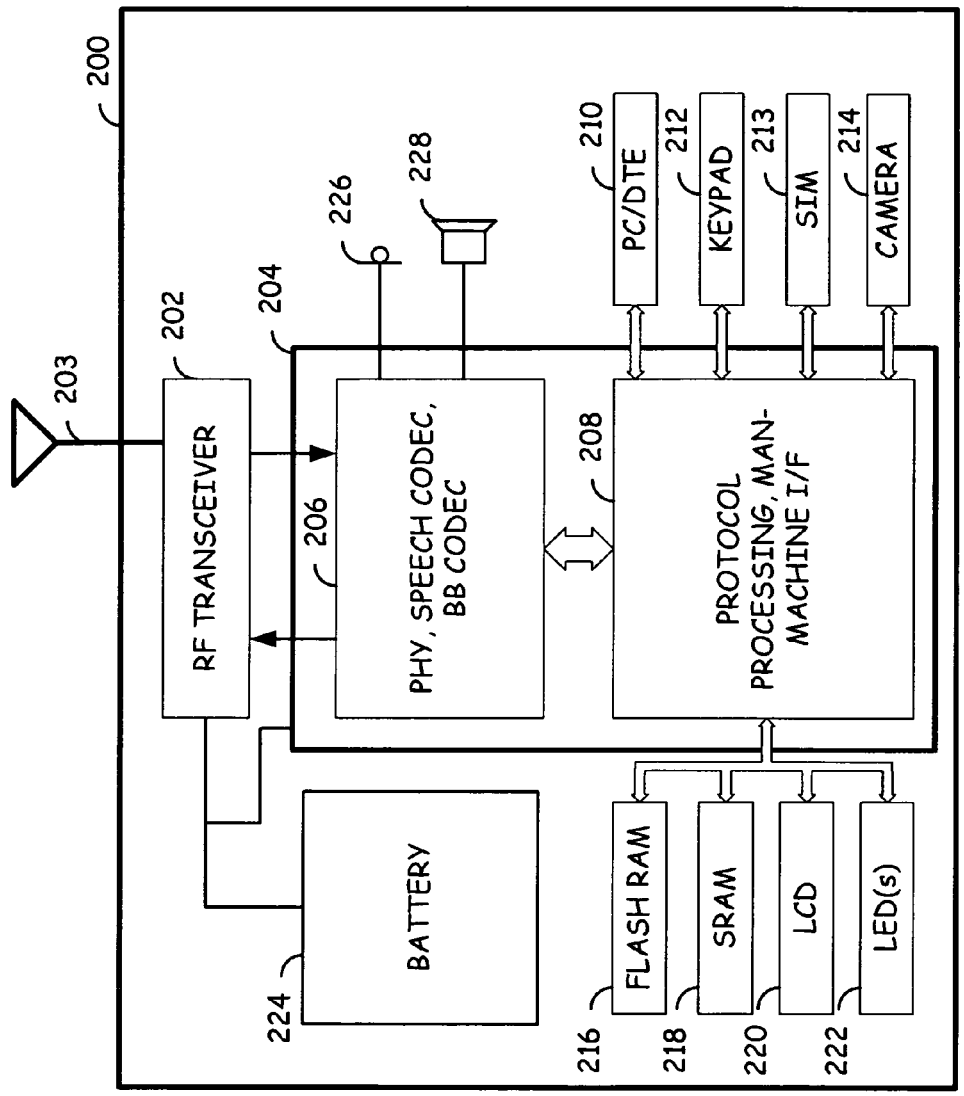
FIG. 4 is a block diagram functionally illustrating a wireless terminal constructed according to the present invention.

FIG. 4 is a block diagram functionally illustrating a wireless terminal 200 constructed according to the present invention. The wireless terminal 200 of FIG. 4 includes an RF transceiver 202, digital processing components 204, and various other components contained within a housing. The digital processing components 204 includes two main functional components, a physical layer processing, speech COder/DEcoder (CODEC), and baseband CODEC functional block 206 and a protocol processing, man-machine interface functional block 208. A Digital Signal Processor (DSP) is the major component of the physical layer processing, speech COder/DECoder (CODEC), and baseband CODEC functional block 206 while a microprocessor, e.g., Reduced Instruction Set Computing (RISC) processor, is the major component of the protocol processing, man-machine interface functional block 208. The DSP may also be referred to as a Radio Interface Processor (RIP) while the RISC processor may be referred to as a system processor. However, these naming conventions are not to be taken as limiting the functions of these components.

The RF transceiver 202 couples to an antenna 203, to the digital processing components 204, and also to a battery 224 that powers all components of the wireless terminal 200. The physical layer processing, speech COder/DECoder (CODEC), and baseband CODEC functional block 206 couples to the protocol processing, man-machine interface functional block 208 and to a coupled microphone 226 and speaker 228. The protocol processing, man-machine interface functional block 208 couples to a Personal Computing/Data Terminal Equipment interface 210, a keypad 212, a Subscriber Identification Module (SIM) port 213, a camera 214, a flash RAM 216, an SRAM 218, a LCD 220, and LED(s) 222. The camera 214 and LCD 220 may support either/both still pictures and moving pictures. Thus, the wireless terminal 200 of FIG. 4 supports video services as well as audio services via the cellular network.

Figure 5:
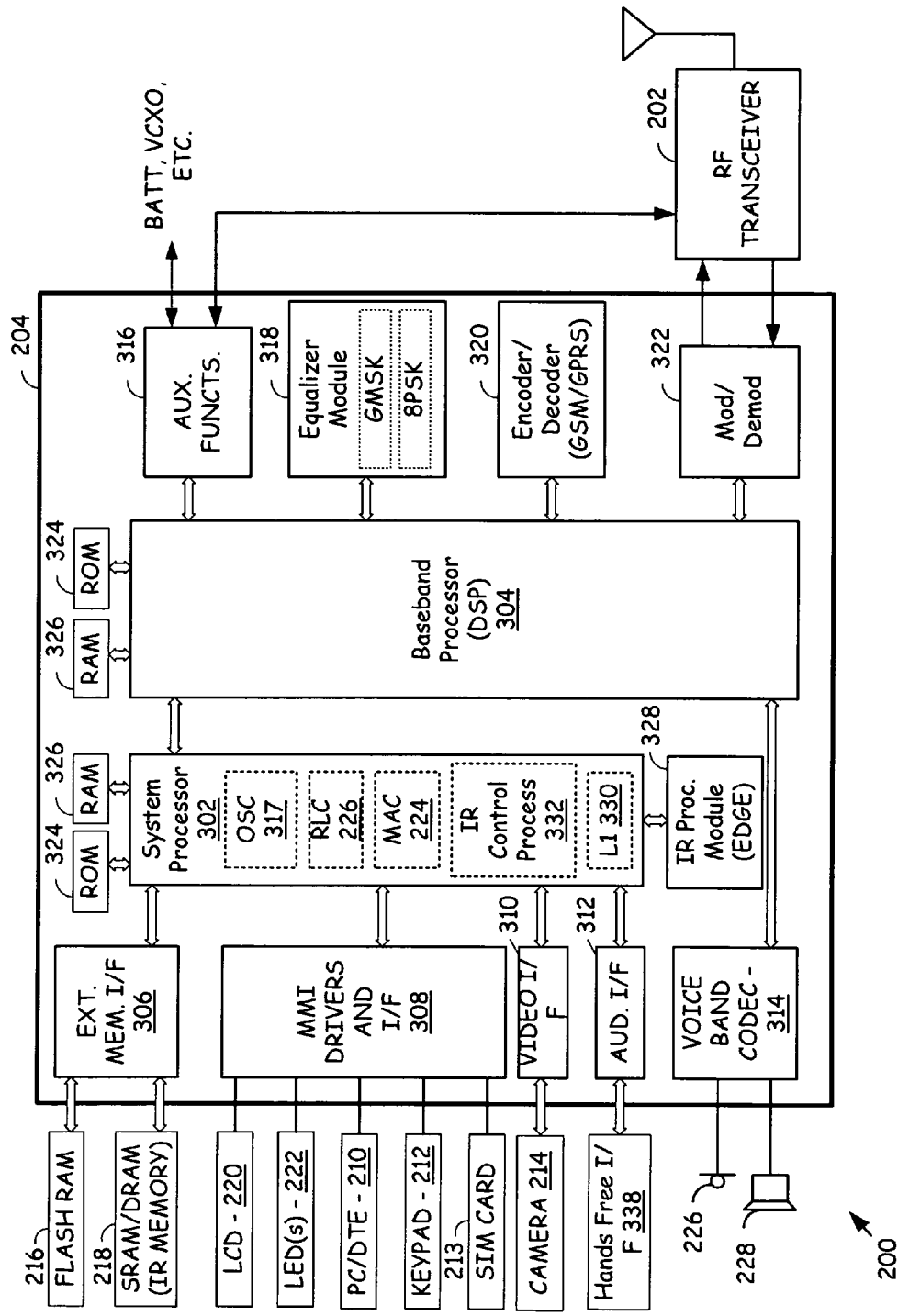
FIG. 5 is a block diagram illustrating in more detail the wireless terminal of FIG. 4, with particular emphasis on the digital processing components of the wireless terminal.

FIG. 5 is a block diagram illustrating in more detail the wireless terminal of FIG. 4, with particular emphasis on the digital processing components of the wireless terminal. The digital processing components 204 include a system processor 302, a baseband processor 304, and a plurality of supporting components. The supporting components include an external memory interface 306, MMI drivers and I/F 308, a video I/F 310, an audio I/F 312, a voice band CODEC 314, auxiliary functions 316, at least one clock or oscillator circuit 317, a modulator/demodulator 322, ROM 324, RAM 326 and a plurality of processing modules. In some embodiments, the modulator/demodulator 322 is not a separate structural component with these functions being performed internal to the baseband processor 304.

The processing modules are also referred to herein as accelerators, co-processors, processing modules, or otherwise, and include auxiliary functions 316, an equalizer module 318, an encoder/decoder module 320, and an Incremental Redundancy (IR) processing module 328. The interconnections of FIG. 5 are one example of a manner in which these components may be interconnected. Other embodiments support additional/alternate couplings. Such coupling may be direct, indirect, and/or may be via one or more intermediary components.

RAM and ROM service both the system processor 302 and the baseband processor 304. Both the system processor 302 and the baseband processor 304 may couple to shared RAM 326 and ROM 324, couple to separate RAM, coupled to separate ROM, couple to multiple RAM blocks, some shared, some not shared, or may be served in a differing manner by the memory. In one particular embodiment, the system processor 302 and the baseband processor 304 coupled to respective separate RAMs and ROMs and also couple to a shared RAM that services control and data transfers between the devices. The processing modules 316, 318, 320, 322, and 328 may coupled as illustrated in FIG. 5, but may also be coupled in other manners in differing embodiments.

The system processor 302 services at least a portion of a serviced protocol stack, e.g., GSM/GPRS/EDGE protocol stack. In particular the system processor 302 services Layer 1 (L1) operations 330, a portion of Incremental Redundancy (IR) GSM protocol stack operations 332 (referred to as "IR control process"), Medium Access Control (MAC) operations 334, and Radio Link Control (RLC) operations 336. The baseband processor 304 in combination with the modulator/demodulator 322, RF transceiver, equalizer module 318, and/or encoder/decoder module 320 service the Physical Layer (PHY) operations performed by the digital processing components 204.

A clock module or oscillator module 317 may service both the system processor 302 and the baseband processor 304. This module may produce timing information which when accurate may be used to significantly conserve battery power. For example, to conserve power, the wireless terminal may sleep when not actively communicating with a servicing base station. However, to ensure no communications are missed, the wireless terminal awakens periodically to receive a page burst that indicates if the wireless terminal must service a communication from the servicing base station. A description of this process will be described with reference to FIG. 6. Various other electronic devices known to those having skill in the art may also enter a sleep mode as well in order to conserve power. To realize this advantage, the timing associated with the sleep mode should be accurately controlled based on timing signals produced by oscillator module 317 in order to allow the wireless telephone to awaken at predetermined intervals to check for received messages or pages.

Figure 6:
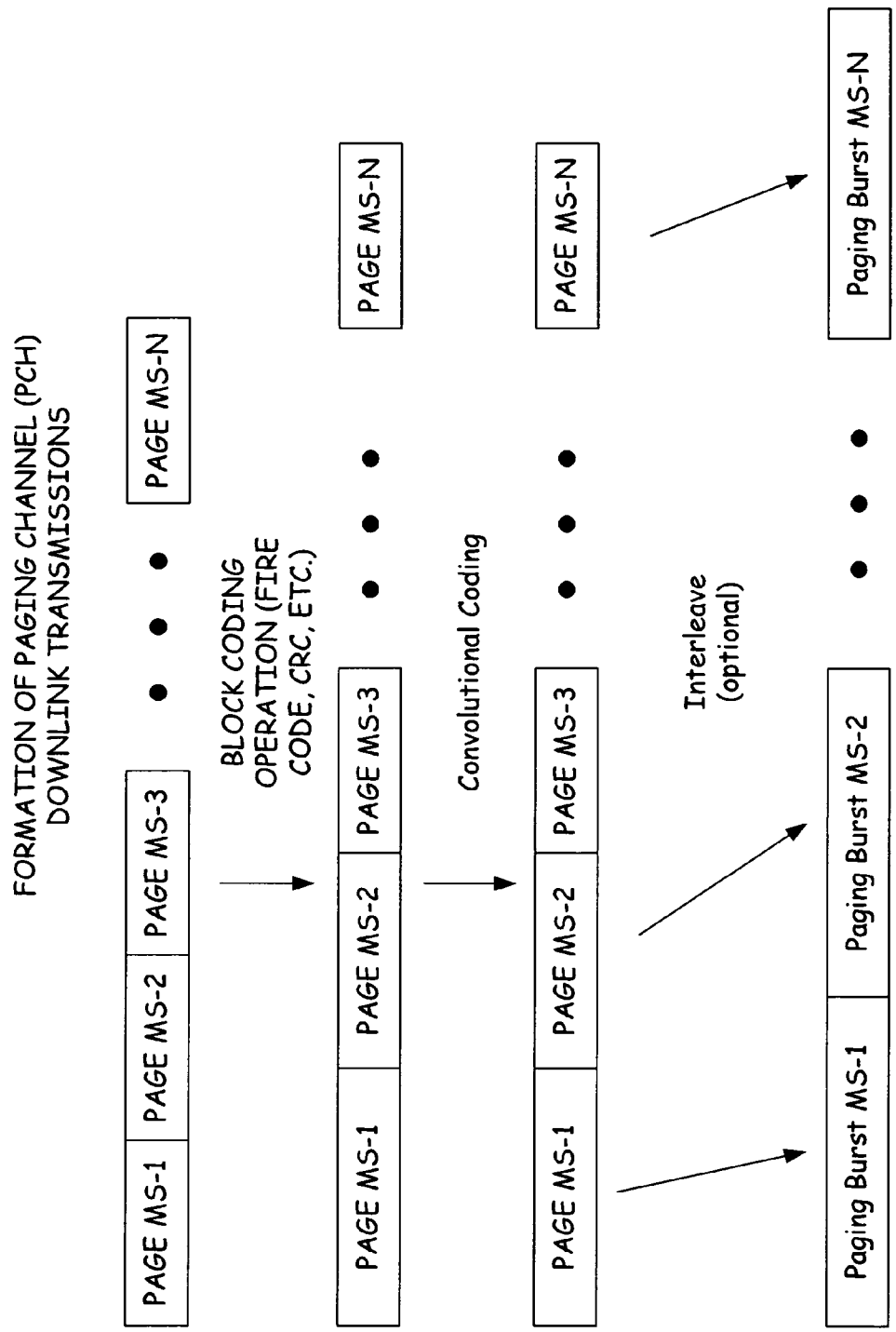
FIG. 6 is a block diagram illustrating the formation of paging channel downlink transmissions.

FIG. 6 depicts the various stages associated with forming and interpreting paging channel (PCH) downlink transmissions. The original pages for the individual wireless terminals or mobile stations are initially divided into a series of pages to be transmitted according to a predetermined schedule to the wireless terminals. This predetermined schedule allows the individual wireless terminals, when not actively transmitting, to enter a sleep mode and merely awaken when it is necessary to receive their respective page bursts. As shown here, the original page undergoes two stages of encoding. First, the original pages undergo a block coding operation that is typically referred to as outer encoding. The block coding stage, allows for the detection of errors within the data block. In addition, the Data blocks may be supplemented with tail bits or block code sequence. Since Block Coding is the first or external stage of channel coding, the block code is also known as an external or outer encoding scheme. Typically, two kinds of codes are used, a cyclic redundancy check (CRC) or a Fire Code. The Fire Codes allow for either error correction or error detection. Error detection with the Fire Code, verifies connectivity.

Next, the pages undergo a second level of encoding that typically is a convolutional coding referred to as inner encoding. The pages may be optionally interleaved to form paging bursts. These paging bursts are what the wireless terminal receives according to the predetermined schedule.

Figure 7:
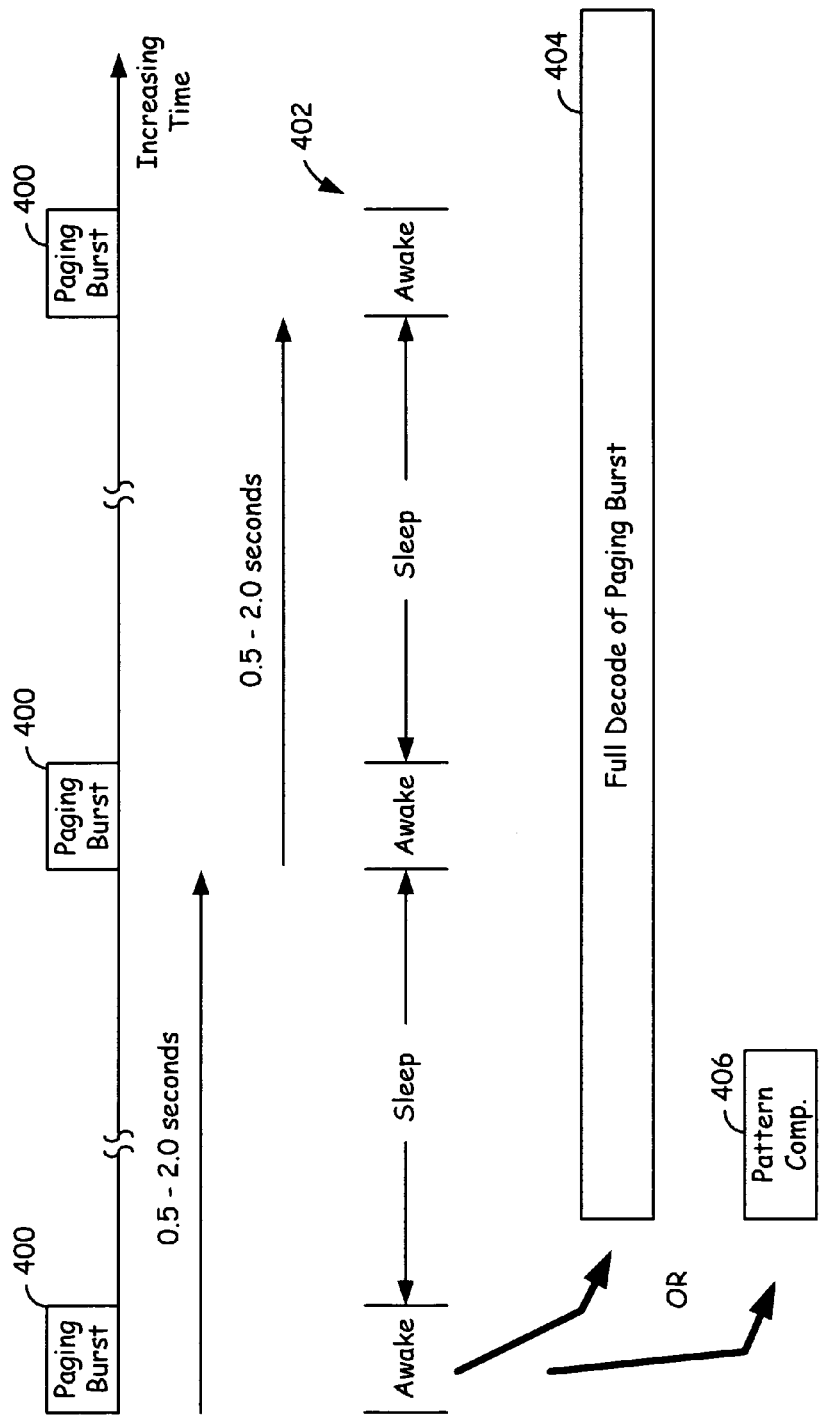
FIG. 7 is a timeline illustrating the receipt and decoding of paging bursts particularly comparing full decoding to partial decoding according to the present invention.

FIG. 7 is a timeline illustrating the receipt and decoding of paging bursts particularly comparing full decoding to partial decoding according to the present invention. Illustrated in FIG. 7 are a series of paging bursts 400 that are received according to paging groups received approximately every 0.5 to 2.0 seconds. The paging bursts carry either a page or a null page for each wireless terminal assigned to a corresponding paging group. When carrying a page, the paging burst 400 signal the wireless terminal to respond to the servicing base station. This may involve servicing a voice call, data or text. When the paging burst 400 is sent, individual wireless terminals that are assigned to the paging group awaken for a period of time indicated by the awake portion of timeline 402 to receive the paging burst.

Typically, 4 paging bursts makeup every paging message and traditionally all 4 paging bursts need to be received before decoding can begin. By making use of the Null page template a sufficiently reliable indication of whether or not the paging message contains any useful information for the mobile can be obtained from only the 1st paging burst of the 4 paging bursts without waiting the 4 paging bursts. If after receiving the 1st paging burst and performing the null pattern match the result is inconclusive then the 2nd paging burst can be received and tested for conformity to the null paging message, and so on until all 4 bursts have been received. As one can appreciate, each paging burst which does not have to be received over the air-interface provides measurable and useful power consumption benefits. If all 4 paging bursts of the block are received and decoded, this constitutes normal paging message reception/decoding. The benefits result from reducing the time that the radio (RF) portion of the receiver is employed (receiving 1 or 2 bursts instead of 4 bursts) and bypassing a large amount of unnecessary baseband message decoding and further processing to understand the contents of the message.

Timeline 402 shows that the wireless terminal's processors are either awake or asleep. When the wireless terminal awakens it may fully decode the paging burst. Alternatively, according to the present invention, when there is a favorable pattern comparison between the paging burst and a null page pattern, the wireless terminal determines that the paging burst is a null page. However, one should note that a null page might be required to be fully decoded. Time segments 404 and 406 show that the time required to fully decode the paging burst is much greater than that required to merely perform a pattern comparison on the processed paging burst with an existing pattern. Therefore one can appreciate that the wireless terminal will remain awake much longer when a full decode of the paging burst is required. This means that additional power will be consumed and processing resources will be utilized to fully decode the paging burst when compared to merely conducting a pattern comparison as indicated in block 406.

Figure 1:
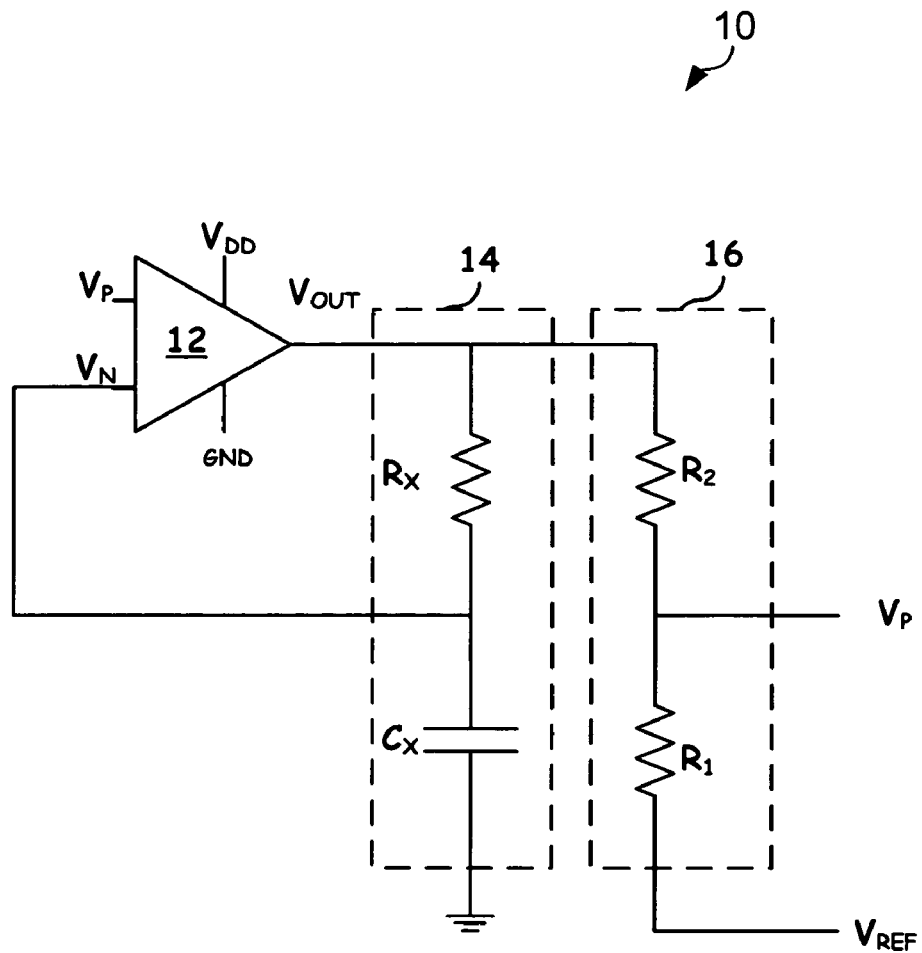
FIG. 1 depicts a general Schmitt trigger RC oscillator.
Figure 8:
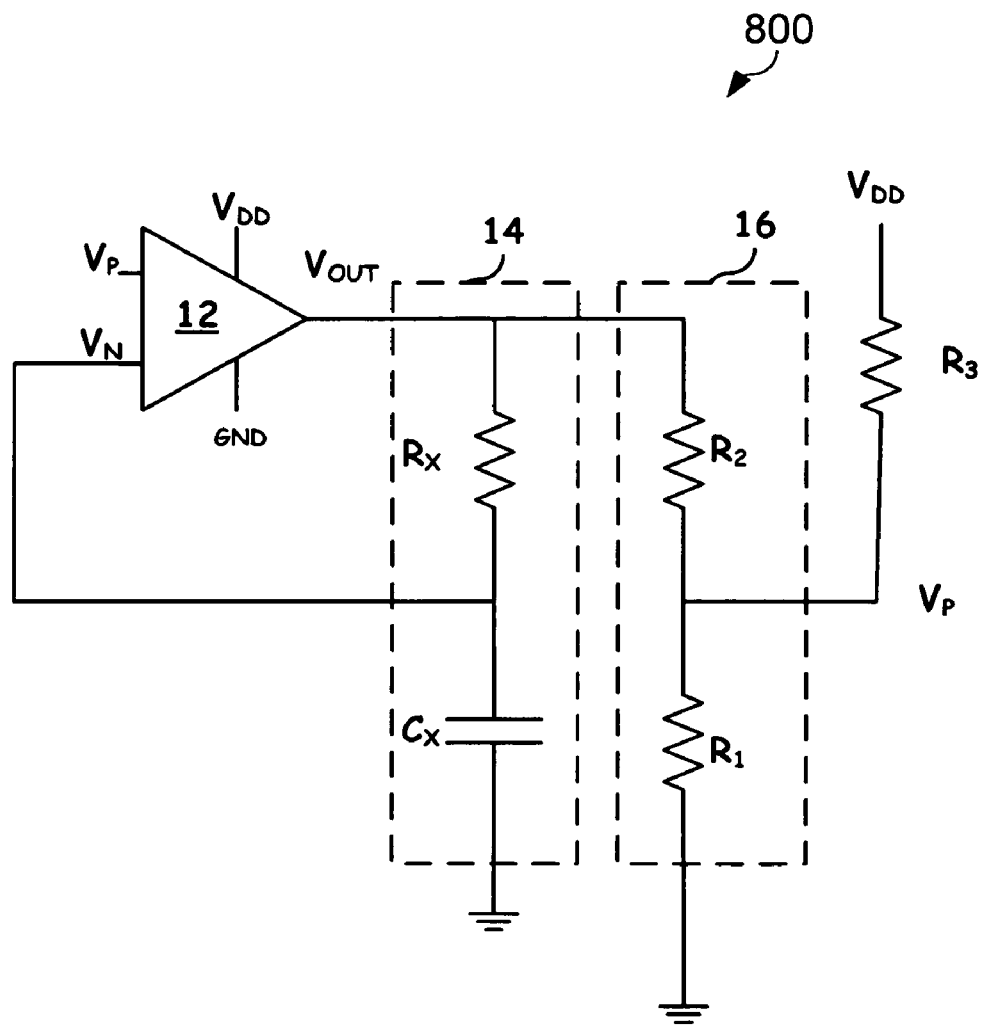
FIG. 8 depicts a general Schmitt trigger RC oscillator according to an embodiment of the present invention.

FIG. 8 depicts a general Schmitt trigger RC oscillator 800. Schmitt trigger RC oscillator 800, like Schmitt trigger RC oscillator 10 of FIG. 1 includes an operational amplifier 12 that receives a first voltage input or threshold voltage input, $V_P$, and a second voltage input, $V_N$. Operational amplifier 12 generates an output voltage, $V_{OUT}$, equal to a first output voltage, $V_{DD}$, when $V_P$ is greater than $V_N$; or a second output voltage, such as ground, when $V_P$ is less than $V_N$. However, as shown here, a defined relationship exists between $V_P$ and $V_{DD}$. Resistive capacitive (RC) network 14 couples to the output of operational amplifier 12 and supplies $V_N$ to operational amplifier 12. Additionally a voltage divider 16 also couples to the output of operational amplifier 12. The relationship between $V_P$ and $V_{DD}$ is defined by the values of the resistances of the voltage divider 16. As shown here, $V_P$ is supplied from the voltage divider 16, as the voltage seen at the node between resistors R1 and R2.

In order to simplify analysis, one can assume $R_1=R_2=R_3$. When $V_P>V_N$, $V_{OUT}$ goes to $V_{DD}$ and begins to charge capacitor $C_X$. This increases the voltage $V_N$. During this charging period, $V_{P1}=(2/3)*V_{DD}$. When $V_N$ exceeds the switching point $V_P$, $V_{OUT}$ goes to ground and begins to discharge capacitor $C_X$. This decreases the voltage $V_N$. During this discharging period, $V_{P2}=(1/3)*V_{DD}$. Thus, the switching point, $V_P$, is no longer defined as a function of $V_{REF}$. Rather, the switching point is a predetermined portion of $V_{DD}$. During Charging Period, $V_N$ may be defined as $$V_N = V_{DD}\left(1 - e^{\frac{-t_1}{R_X C_X}}\right) + \frac{1}{3}V_{DD}\left(e^{\frac{-t_1}{R_X C_X}}\right) = \frac{2}{3}V_{DD}.$$

During the discharging period, $V_N$ may be defined as $$V_N = \frac{2}{3}V_{DD} * e^{\frac{-(t_2-t_1)}{R_X C_X}} = \frac{1}{3}V_{DD}.$$

Solving these two equations, where $R_1=R_2=R_3$, yields an expression for the period of the oscillator be defined as $t_2=2\ln(2*R_X C_X)$. Thus, the frequency of the oscillator may be defined as $$\frac{1}{t_2},$$

which is a function Rx and Cx.

Figure 2:
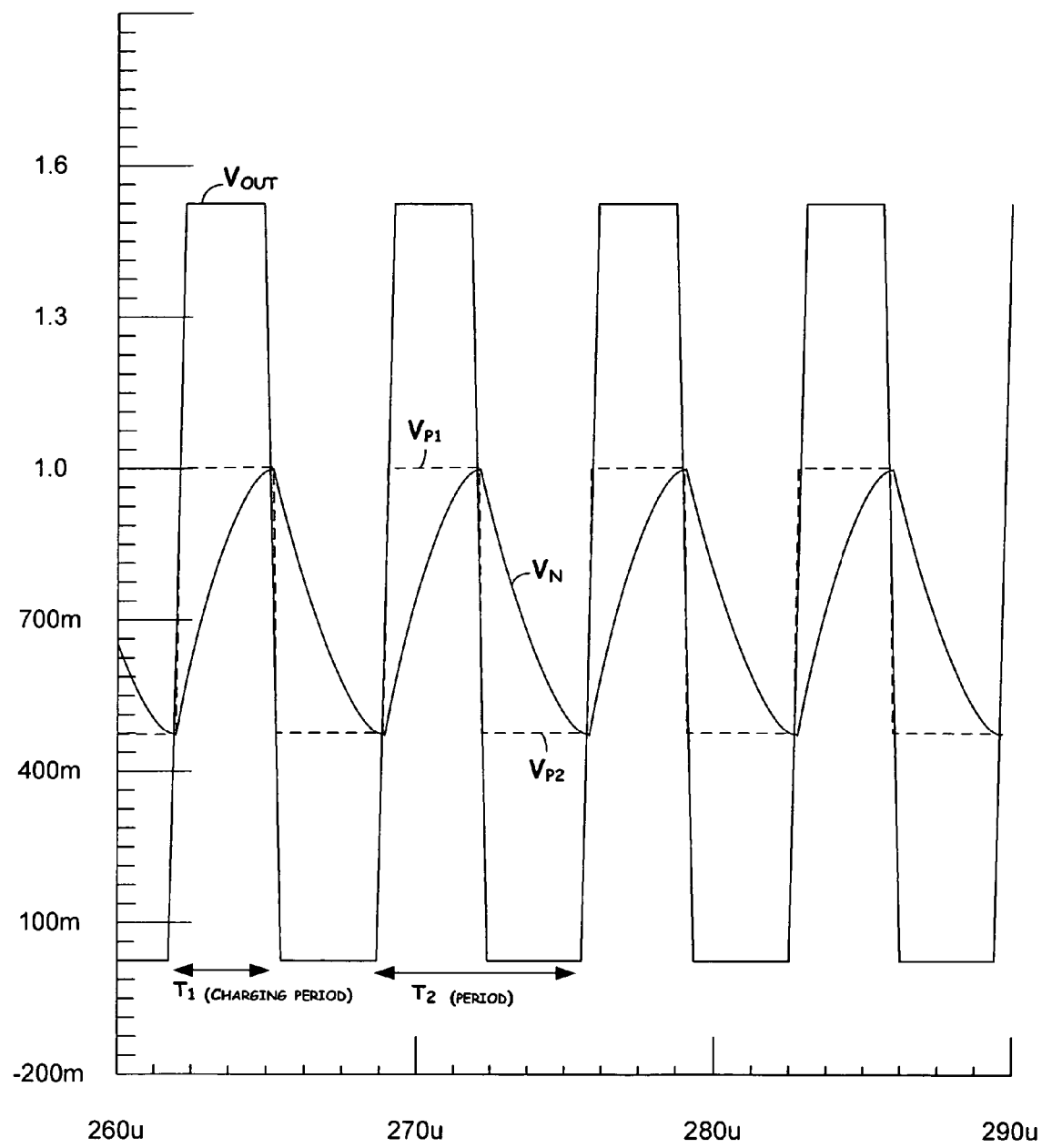
FIG. 2 depicts the output of an operational amplifier.

The output of the operational amplifier may be a continuous square wave as previously described with reference to FIG. 2. The frequency of this square way depends only on the values of $R_X$ and $C_X$ as the dependence on the threshold points of the Schmitt trigger and reference voltage have been canceled out by replacing the reference with ground and making the threshold points a function of $V_{DD}$. The Schmitt trigger RC oscillator circuit may be easily incorporated within an integrated circuit (IC) such as that containing or coupled to oscillator module 317 that may service both the system processor 302 and the baseband processor 304. This oscillator provides greater frequency stability as the frequency is not dependent on the input voltage $V_{DD}$ for the reasons shown above. As the input voltage can vary as much as +/−10 percent, the possibility of frequency variations is reduced or eliminated. This reduced level of variation makes this Schmitt trigger RC oscillator an acceptable and accurate timing source for determining when to awaken from or enter into the sleep mode and effectively conserve power.

Figure 9:
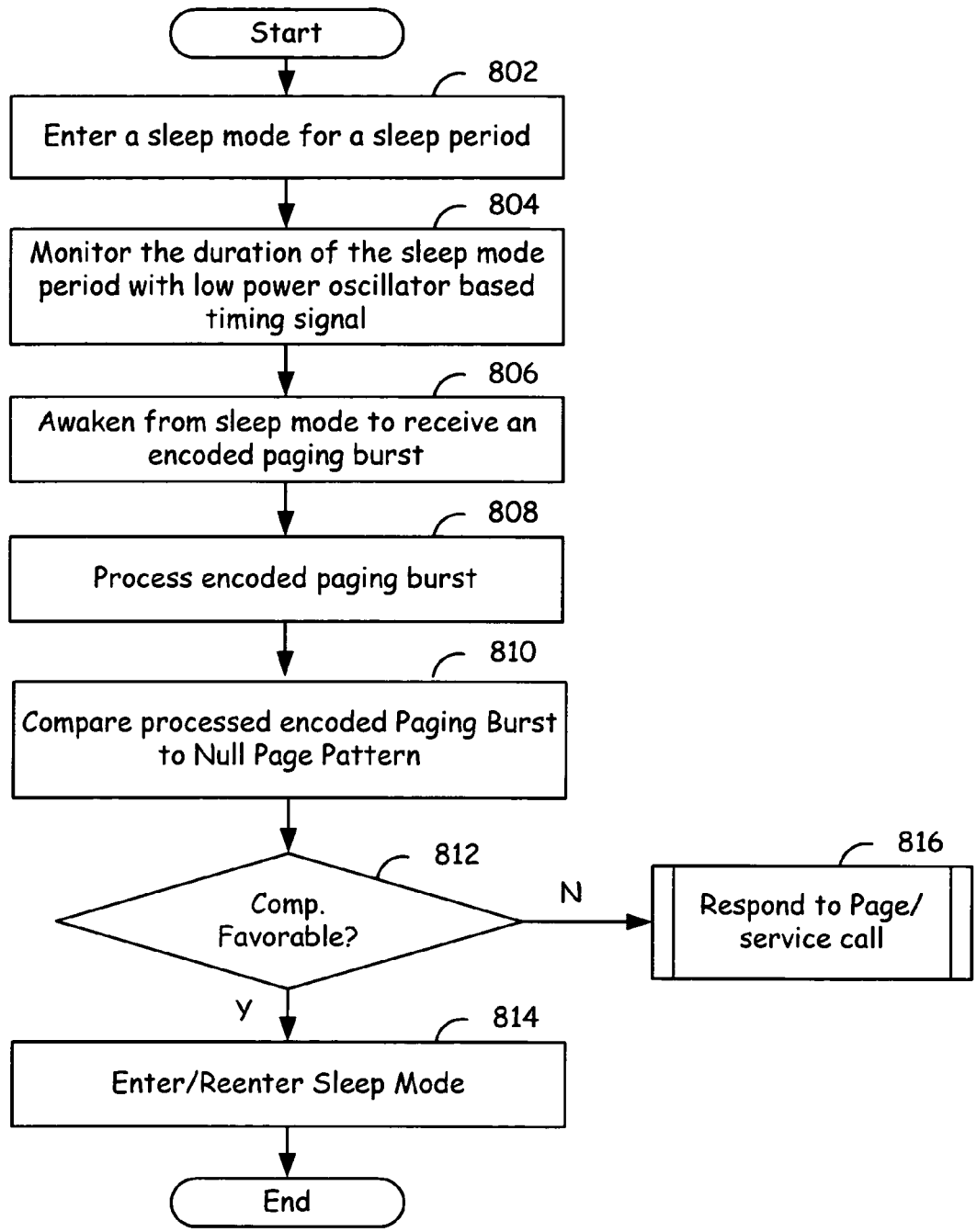
FIG. 9 is a logic flow diagram illustrating one method of utilizing the Schmitt Trigger RC Oscillator of FIG. 8 according to an embodiment of the present invention.

FIG. 9 is a logic flow diagram illustrating one method of utilizing the Schmitt Trigger RC Oscillator, for which one embodiment is described in FIG. 8, in order to provide a timing signal having a steady frequency within a portable electronic device such as a wireless terminal. Beginning with Step 802, the portable electronic device, such as but not limited to a wireless terminal, enters a sleep mode for a sleep period. The Schmitt Trigger RC Oscillator circuit is used to monitor the duration of the sleep mode in Step 804. Because the Schmitt Trigger RC Oscillator Circuit is a lower power oscillator, battery power of the portable electronic device is able to be conserved. Additionally, by eliminating the frequency variations as seen when comparing the Schmitt Trigger RC Oscillator circuits of FIG. 1 and FIG. 8, a more accurate determination of the time to awaken the portable electronic device may be determined such that in Step 806 the portable electronic device may be awakened from the sleep mode in order to receive an encoded paging burst. Previous timing inaccuracies would have decreased the actual time spent in the sleep mode or required higher power oscillator circuits to be employed. This burst is processed in Step 808. A comparison of the results of processing the encoded paging burst are made with a null page pattern, or other like means, to determine whether or not the encoded paging burst received is a null page. At Decision Point 812, when the comparison made to determine whether or not the received encoded paging burst corresponds to a null page pattern is favorable, the process may continue to Step 814 wherein the portable electronic device is able to enter or reenter the sleep mode. In this way additional battery power may be conserved during the next sleep mode. However, if the comparison is unfavorable at Decision Point 812, it may be necessary to fully awaken the portable electronic device in order to respond to the page/service call at Step 816.

In summary, embodiments of the present invention provide an oscillator circuit having a steady output frequency that is independent of the supplied voltage. This oscillator includes a Schmitt trigger circuit which may be implemented within an integrated circuit of a wireless terminal or other like portable electronic device. The Schmitt trigger circuit receives a threshold voltage input and a second voltage input. The Schmitt trigger circuit generates an output voltage equal to either a first output voltage or a second output voltage based on the results of comparing the threshold voltage input to the second voltage input. An RC network may be coupled to the output of the Schmitt trigger circuit and is operable to supply the second voltage input to the Schmitt trigger circuit. A voltage divider network also couples to the output of the Schmitt trigger circuit wherein the threshold voltage input is proportional to the first output voltage reduced by the voltage divider network based on the output voltage of the Schmitt trigger circuit.

Additional embodiments may employ the Schmitt trigger RC oscillator circuit within portable electronic devices or devices where it is desirable to conserve power, such as a wireless terminal, such that a low power oscillator circuit may be used to provide a steady frequency timing signal for the purpose of determining when to awaken from and enter into a sleep mode in order to conserve power.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An oscillator circuit having an output frequency independent of a supplied voltage, comprising:

an operational amplifier, having a threshold voltage input and second voltage input, wherein the operational amplifier generates an output voltage equal to:
 a first output voltage when the threshold voltage input is greater than the second voltage input voltage; and
 a second output voltage when the threshold voltage input is less than the second voltage input;
a resistive-capacitive (RC) network, including a first resistor and a first capacitor coupled in series, wherein the first resistor couples to an output of the operational amplifier, and the capacitor couples to ground, wherein a node between the first resistor and the first capacitor couples to the second voltage input; and
a voltage divider network wherein the threshold voltage is sampled from within the voltage divider network and wherein the threshold voltage is proportional to the first output voltage supply based on the voltage divider network and the output frequency is determined by the RC network.

2. The oscillator circuit of claim 1, implemented within an integrated circuit (IC) of a wireless terminal.

3. The oscillator circuit of claim 2, wherein the wireless terminal awakens from a sleep mode based on a timing signal derived from the output of the operational amplifier.

4. The oscillator circuit of claim 3, wherein the sleep mode period ranges between about 0.5 seconds to about 2.0 seconds.

5. The oscillator circuit of claim 3, wherein the wireless terminal awakens from a sleep mode at the expiration of the sleep mode to receive at least one paging burst.

6. The oscillator circuit of claim 3, wherein voltage divider network comprises a plurality of resistors.

7. The oscillator circuit of claim 1, wherein the first output voltage is $V_{DD}$ and the second output voltage is ground.

8. An oscillator circuit having an output frequency independent of the supplied voltage, comprising:
an amplifier circuit circuit implemented within an integrated circuit, wherein the amplifier circuit receives a threshold voltage input and second voltage input, wherein the amplifier circuit generates an output voltage equal to:
 a first output voltage when the threshold voltage input is greater than the second voltage input voltage; and
 a second output voltage when the threshold voltage input is less than the second voltage input;
a grounded resistive-capacitive (RC) network, coupled to the output of the amplifier circuit and operable to supply the second voltage input to the amplifier circuit; and
a voltage divider network operable coupled to the first voltage, wherein the threshold voltage input is proportional to the first voltage as determined by the voltage divider network.

9. The oscillator circuit of claim 8, implemented within an integrated circuit (IC) of a wireless terminal.

10. The oscillator circuit of claim 9, wherein the wireless terminal awakens from a sleep mode based on a timing signal derived from the output of the circuit.

11. The oscillator circuit of claim 10, wherein the sleep mode period ranges between about 0.5 seconds to about 2.0 seconds.

12. The oscillator circuit of claim 9, wherein the wireless terminal awakens from a sleep mode at the expiration of the sleep mode to receive at least one paging burst.

13. The oscillator circuit of claim 8, wherein voltage divider network comprises a plurality of resistors.

14. The oscillator circuit of claim 8, wherein the first output voltage is $V_{DD}$ and the second output voltage is ground.

15. A method of conserving battery power within a wireless terminal, comprising:
- entering a sleep mode for a sleep mode period;
- monitoring the duration of the sleep mode period with a timing signal provided by a Schmitt trigger resistive-capacitive (RC) oscillator circuit;
- awakening from the sleep mode to receive an encoded paging burst at the end of the sleep mode period;
- processing the encoded paging burst to determine if the encoded paging burst is a null page; and
- re-entering the sleep mode for an additional sleep mode period when the encoded paging burst is a null page; or
- awakening the wireless terminal for further processing when the encoded paging burst is not a null page.

16. The method of claim 15, wherein the Schmitt trigger RC oscillator circuit is operable to provide an output timing signal having an output frequency independent of a supplied voltage, wherein the Schmitt trigger RC oscillator circuit further comprises:
- an amplifier circuit circuit implemented within an integrated circuit, wherein the amplifier circuit receives a threshold voltage input and second voltage input, wherein the amplifier circuit generates an output voltage equal to:
  - a first output voltage when the threshold voltage input is greater than the second voltage input voltage; and
  - a second output voltage when the threshold voltage input is less than the second voltage input;
- a grounded RC network, coupled to the output of the amplifier circuit and operable to supply the second voltage input to the amplifier circuit; and
- a voltage divider network operable coupled to the first voltage, wherein the threshold voltage input is proportional to the first voltage as determined by the voltage divider network.

17. The method of claim 15, wherein the wireless terminal awakens from the sleep mode based on a timing signal derived from the output of the Schmitt trigger RC oscillator circuit.

18. The method of claim 15, wherein the sleep mode period ranges between about 0.5 seconds to about 2.0 seconds.

19. The method of claim 16, wherein voltage divider network comprises a plurality of resistors.

20. The method of claim 16, wherein the first output voltage is $V_{DD}$ and the second output voltage is ground.

21. A wireless terminal that comprises:
- a Radio Frequency (RF) front end;
- a baseband processor communicatively coupled to the RF front end;
- an enCOder/DECoder (CODEC) processing module communicatively coupled to the baseband processor; and
- a Schmitt trigger resistive-capacitive (RC) oscillator circuit coupled to the baseband processor; and wherein:
- during a first time period, the RF front end, the baseband processor, and the CODEC processing module are operable to:
  - receive an encoded paging burst on a paging channel;
  - decode the encoded paging burst to produce a decoded paging burst;
  - determine that the decoded paging burst contains a null page for the wireless terminal;
  - process the encoded paging burst to produce a null page pattern; and
  - enter a sleep mode for a sleep mode period, wherein the duration of the sleep mode period is monitored with a timing signal provided by the Schmitt trigger RC oscillator circuit; and
- during a second time period, the RF front end, the baseband processor, and the CODEC processing module are operable to:
  - awaken from the sleep mode to receive an additional encoded paging burst on the paging channel by monitoring the length of the sleep mode period with the Schmitt trigger RC oscillator circuit;
  - process the additional encoded paging burst to produce a processed encoded paging burst;
  - compare the processed encoded paging burst to the null page pattern; and
  - when the comparison is favorable, determining that the additional encoded paging burst is a null page.

* * * * *